United States Patent [19]

Minamizono et al.

[11] Patent Number: 4,581,313
[45] Date of Patent: Apr. 8, 1986

[54] PHOTOSENSITIVE COMPOSITION WITH POLYMER HAVING DIAZONIUM SALT IN SIDE CHAIN

[75] Inventors: Junji Minamizono; Toshiyuki Sekiya, both of Shizuoka, Japan

[73] Assignee: Fuji Photo Film Co., Ltd., Kanagawa, Japan

[21] Appl. No.: 556,821

[22] Filed: Dec. 1, 1983

[30] Foreign Application Priority Data

Dec. 1, 1982 [JP] Japan ................. 57-211006

[51] Int. Cl.$^4$ .......................... G03C 1/54; G03F 7/08
[52] U.S. Cl. ..................................... 430/175; 430/145; 430/176; 430/190; 430/195; 430/302; 430/325; 534/561; 534/565
[58] Field of Search ............... 430/175, 176, 190, 195, 430/302, 325, 145; 534/561, 565

[56] References Cited

U.S. PATENT DOCUMENTS

| | | | |
|---|---|---|---|
| 2,649,373 | 8/1953 | Neugebauer et al. | 430/175 |
| 3,174,860 | 3/1965 | Sus et al. | 430/175 |
| 3,467,630 | 9/1969 | Danhauser et al. | 430/195 |
| 3,679,419 | 7/1972 | Gillich | 430/175 |
| 3,915,707 | 10/1975 | Gessuein | 430/175 |
| 4,147,552 | 4/1979 | Specht et al. | 430/195 |
| 4,215,041 | 7/1980 | Phlipot et al. | 534/561 |
| 4,442,196 | 4/1984 | Iwaki et al. | 430/195 |

FOREIGN PATENT DOCUMENTS

| | | | |
|---|---|---|---|
| 58-62641 | 4/1983 | Japan | 430/145 |
| 2018779 | 10/1979 | United Kingdom | 430/302 |
| 2044788 | 10/1980 | United Kingdom | 430/175 |

OTHER PUBLICATIONS

Kosar, J., "Light-Sensitive Systems", J. Wiley and Sons, 1965, pp. 201-203 and 212-214.

*Primary Examiner*—Charles L. Bowers, Jr.
*Attorney, Agent, or Firm*—Sughrue, Mion, Zinn, Macpeak and Seas

[57] ABSTRACT

A photosensitive composition containing a polymer, and a photosensitive material utilizing the composition are disclosed. The polymer, which may be in the form of a copolymer, includes a repeating unit of the formula (I):

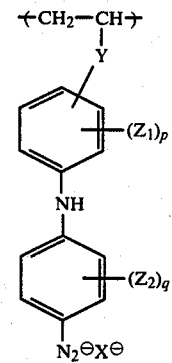

wherein Y is a divalent substituent; $Z_1$ and $Z_2$ independently each represents monovalent substituents; p and q are each 0 or an integer of 1 to 4; when p and q are each 2 or more, each of $Z_1$ and $Z_2$ may be the same or different; $X^\ominus$ is an anion. The composition has high sensitivity and is capable of forming an image on a suitable photographic support without causing fog under incandescent lamps. The composition can be used to produce lithographic printing plates having high sensitivity as well as excellent ware resistance.

8 Claims, No Drawings

PHOTOSENSITIVE COMPOSITION WITH POLYMER HAVING DIAZONIUM SALT IN SIDE CHAIN

FIELD OF THE INVENTION

The present invention relates to a high-polymeric compound having a novel photosensitive diazonium salt. More particularly, the invention relates to a high-polymeric compound with a photosensitive diazonium salt for use in the manufacture of printing plates such as lithographic plates, and printed circuit boards (PCBs).

BACKGROUND OF THE INVENTION

It is conventionally known to prepare photosensitive copying materials from diazo resins, or condensates of formaldehyde and p-diazodiphenylamine. The production of these polyfunctional diazo resins is described in U.S. Pat. Nos. 2,679,498; 3,050,502, 3,311,605, 3,163,633, 3,406,159 and 3,277,074. In order to improve the long-term stability of water-soluble diazo resins, they may be rendered water-insoluble and olephilic by reacting them with coupling agents such as acidic aromatic compounds. Methods to achieve this object are described in Japanese Patent Publication No. 1167/72 and U.S. Pat. No. 3,300,309.

However, these conventional diazo resins do not have high solubility in organic solvents such as glycol ethers, alcohols and ketones even if the counter-ion to be paired with the diazonium group is an inorganic ion derived from a hydrohalogenic acid or phosphoric acid or an organic ion derived from an acidic aromatic compound such as benzenesulfonic acid or toluenesulfonic acid.

The sensitivity of these diazo resins may be improved by increasing their molecular weight (degree of polymerization). However, molecular weight control is not easy in condensation reactions from a synthesis point of view. What is more, resins with an increased molecular weight have a significantly reduced solubility in organic solvents and may experience decreased resolution.

Furthermore, the condensate of p-diazodiphenylamine and formaldehyde is very difficult to handle under incandescent lamps without causing fog because it decomposes by absorbing light in the visible spectrum of 420 to 500 nm. This presents a serious problem from a manufacture and use point of view.

Diazo compounds having a polyester group in the backbone are described in Japanese Patent Application (OPI) No. 30121/79 (the symbol OPI as used herein means an unexamined published Japanese patent application), but they are produced by a very special method which is not applicable to other cases. In addition, the ester group in the backbone cleaves so easily that the sensitivity of the diazo compound is decreased during storage after its preparation or application to a photographic support, and as a result, the commercial value of the final product is greatly impaired.

The present inventors have made detailed and extensive studies to eliminate these defects of the known diazo resins, and as a result, they have found a novel diazonium salt containing high-polymeric compounds characterized by high sensitivity and protection against fog under incandescent lamps.

SUMMARY OF THE INVENTION

Therefore, one object of the present invention is to provide a photosensitive composition with high sensitivity that is capable of forming an image on a suitable photographic support without causing fog under incandescent lamps.

Another object of the present invention is to provide a lithographic printing plate with a higher sensitivity.

A further object of the present invention is to provide a photosensitive composition for a lithographic printing plate having high wear resistance and long printing life.

These objects can be achieved by using a polymer or copolymer having a repeating unit of formula (I):

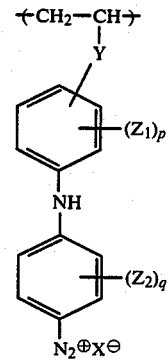

wherein Y is a divalent substituent, preferably one represented by $-A_l B_m C_n$, wherein A and C may be the same or different and represent —O—, —S— or

(R is a substituent such as a hydrogen atom, an alkyl group or substituted alkyl group), and B is an alkylene group, substituted alkylene group (a preferred substituent is a hydroxyl or alkoxy group), an aralkylene group or substituted aralkylene group (a preferred substituent on the benzene ring is a nitro group, a halogen atom, an alkoxyl or alkyl group), and l, m and n are each 0 or 1 except that l and n cannot be 0 at the same time; preferably Y contains an ether bond derived from an active halogen and a phenolic hydroxyl group;

$Z_1$ and $Z_2$ each represent a monovalent substituent, and preferably they represent an alkoxy group having 1 to 6 carbon atoms or an alkyl group having 1 to 6 carbon atoms; p and q are each 0 or an integer of 1 to 4, and when p and q are each 2 to more, each of $Z_1$ and $Z_2$ may be the same or different;

$X^\ominus$ is an anion, and preferred examples include hydrohalogenic acids; phosphoric acids; aliphatic or aromatic phosphonic acids; halogenated Lewis acids such as fluoroboric acid and hexafluorophosphoric acid; perhalogenic acids such as perchloric acid; and aliphatic or aromatic sulfonic acids such as methanesulfonic acid, toleuenesulfonic acid, mesitylenesulfonic acid, sulfosalicylic acid, naphthalene-1-sulfonic acid, 1-naphthol-2-sulfonic acid and 2-oxy-4-methoxybenzophenone-5-sulfonic acid, as described in Japanese Patent Publication Nos. 1167/72, 45322/74 and 48001/74 and U.S. Pat. No. 3,219,447.

DETAILED DESCRIPTION OF THE INVENTION

A preferred compound of formula (I) is such that B represents a substituted aralkylene group, C is —O—, l=0, and m=n=1. Also preferred is a compound wherein Y is bonded to the phenyl group at para-position with respect to the NH group.

Illustrative monomers used to prepare the copolymer include acrylic acid, methacrylic acid, and their alkyl esters (e.g. methyl methacrylate, ethyl acrylate, hydroxyethyl acrylate, propyl acrylate, cyclohexyl acrylate, 2-ethylhexyl acrylate, decyl acrylate, β-cyanoethyl acrylate, β-chloroethyl acrylate, 2-ethoxyethyl acrylate and sulfopropyl methacrylate), vinyl esters (e.g. vinyl acetate, vinyl propionate and vinyl butyrate), vinyl ethers (e.g. methyl vinyl ether, butyl vinyl ether and oleyl vinyl ether), vinyl ketones (e.g. methyl vinyl ketone and ethyl vinyl ketone), styrenes (e.g. styrene, methylstyrene, dimethylstyrene, 2,4,6-trimethylstyrene, ethylstyrene, laurylstyrene, chlorostyrene, methoxystyrene, cyanostyrene, chloromethylstyrene, vinylbenzoic acid, styrene sulfonic acid and α-methylstyrene), vinyl heterocyclic compounds (e.g. vinylpyridine, vinylpyrrolidone and vinylimidazole), acrylonitrile, vinyl chloride, vinylidene chloride, ethylene, propylene, butadiene, diisobutylene, isoprene and chloroprene. These are not the only monomers that can be used to prepare the copolymer according to the present invention, and any copolymer that has the repeating unit of formula (I) may be used.

The proportions of copolymerizable monomers and the molecular weight of the resulting copolymer can be properly selected from any range that satisfies the required sensitivity of the diazonium salt containing high-polymeric compoud, its resolution, and solubility in organic and other solvents. For the purposes of the present invention, the copolymer preferably contains at least 40 mol% of the diazonium salt unit. A preferred molecular weight ranges from several to several hundreds in terms of the degree of polymerization. More specifically, the preferred degree of polymerization ranges from 2 to 500, and 2 to 200 is particularly preferred. However, it should be understood that any copolymer having any molecular weight may be used so long as it has the repeating unit of formula (I).

Typical examples of the diazonium salt containing high-polymeric compound having the formula (I) are listed below but it should be understood that these are not the sole examples that are inclined in the scope of the present invention.

Illustrative Compounds

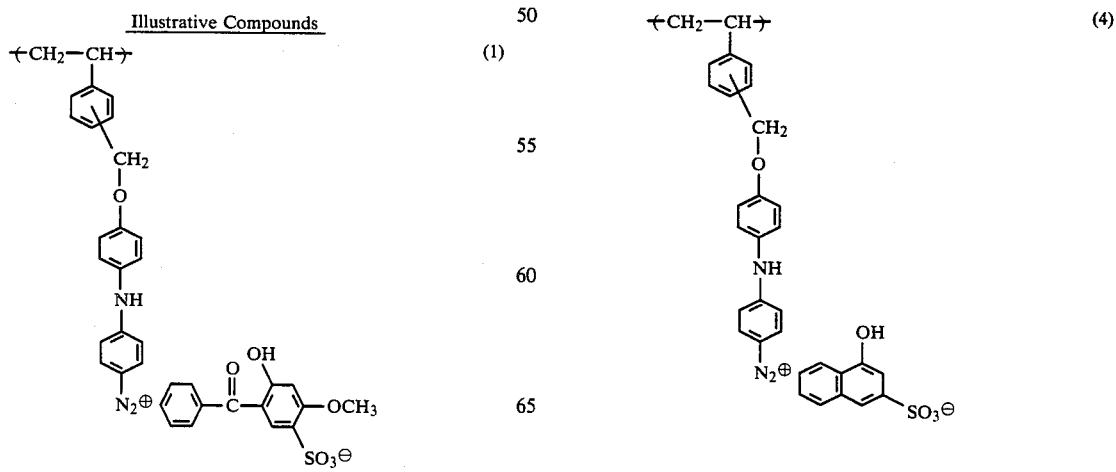

Illustrative Compounds

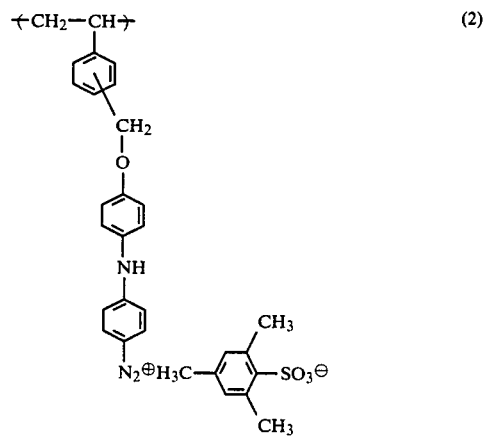

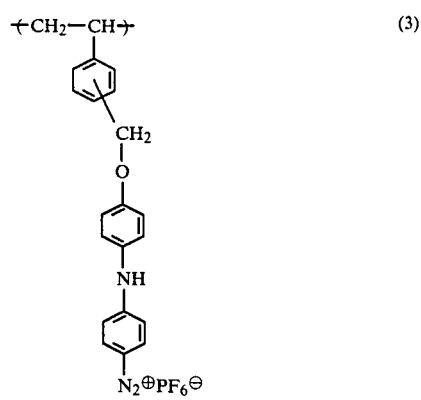

-continued
Illustrative Compounds

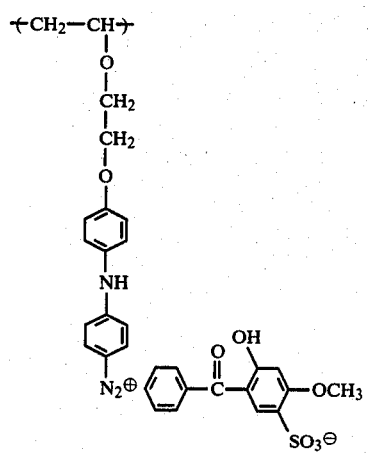 (5)

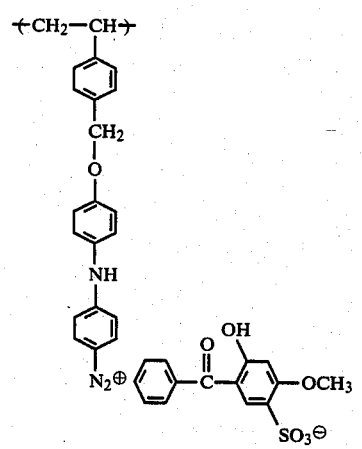 (6)

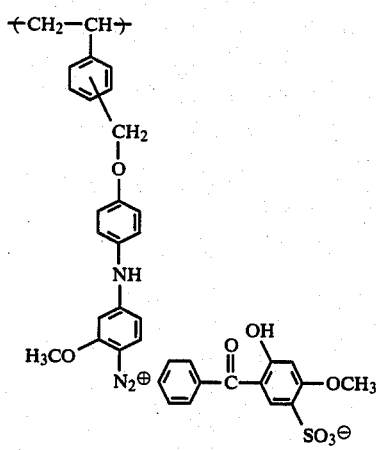 (7)

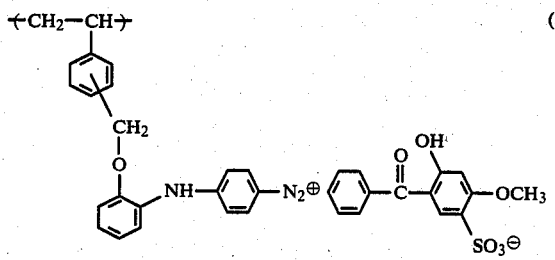 (8)

-continued
Illustrative Compounds

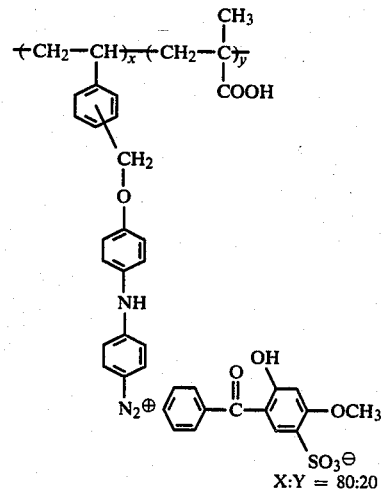 (9)
X:Y = 80:20

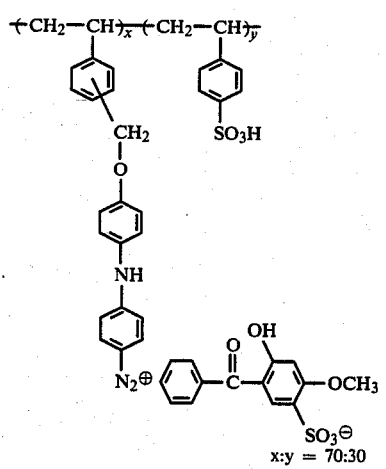 (10)
x:y = 70:30

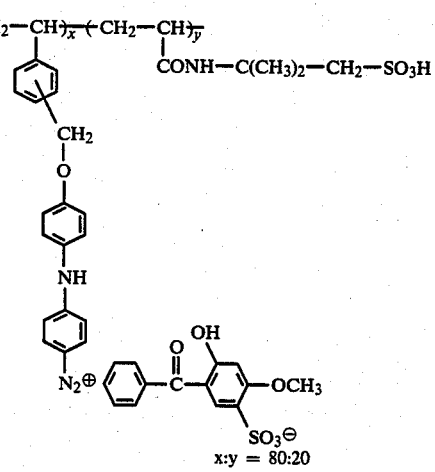 (11)
x:y = 80:20

The novel diazonium compound of the present invention having the repeating unit of formula (I) may be synthesized by the following procedure:

a compound having an active halogen group and a polymerizable group such as a derivative of chloromethylstyrene (a mixture of m- and p-forms) having formula (II):

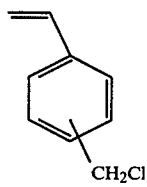

(II)

is reacted with a diphenylamine derivative of formula (III):

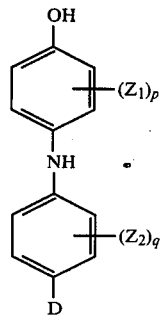

(wherein $Z_1$, $Z_2$, p and q are the same as defined for formula (I); D is a diazonium group or a substituent that can be induced to a diazonium group by reduction or diazotization, such as —$NO_2$, —NO, —$N_2^{\oplus}X^{\ominus}$, —NH-COCH$_3$ or —H) by, for example, the method described in S. R. Sandler and W. Karo, *Organic Functional Group Preparations*, vol. 1, page 102, (Academic Press), so as to prepare a polymerizable monomer of formula (IV):

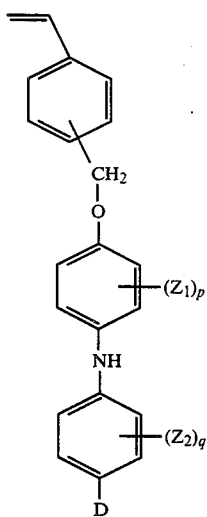

The so prepared monomer is polymerized by an initiator for radical polymerization or cationic polymerization so as to prepare a diazo polymer or a diazo prepolymer.

The diazo prepolymer can be converted to a diazo polymer by a conventional method. In particular, diazotization of a prepolymer having a primary amino group can be effected by reference to S. R. Sandler and W. Karo, supra, vol. 1, page 404, and L. H. Kent et al., *Biochem. J.*, vol. 77, page 12 (1960) (incorporated herein by reference to disclose such a diazotization means).

The compound of formula (III) can be synthesized by condensation of p-aminophenol and 2-chloro-5-nitro- benzenesulfonic acid and subsequently removing the sulfonic acid, as described in F. Ullmann et al., Ber., vol. 42, page 102, and F. L. Bach et al., *J. Med. Chem.*, vol. 10, page 802 (1967), or by reacting 4-acetylamino-4'-methoxy-diphenylamine with boron tribromide or the like to form the corresponding phenolic hydroxyl compound, as described in J. F. McOmie et al., *Org. Synth.*, vol. V, page 412 and R. J. Molyneux et al., *Chem. Commun.*, page 318 (1974) (all of which are incorporated herein by reference to disclose such methods of making the compound of (III)).

The diazonium compound can also be synthesized by any other process, such as high-polymer reaction wherein a polymer or copolymer of the compound of formula (II) is reacted with the compound of formula (III).

A route for the synthesis of a typical compound with the repeating unit of formula (I) is described below.

SYNTHESIS EXAMPLE 1

(Preparation of the starting monomer)

A three-necked flask equipped with a stirrer, a condenser and a thermometer was charged with 24.2 g (0.1 mol) of 4-oxy-4'-acetylaminodiphenylamine, 15.2 g (0.1 mol) of chloromethylstyrene (a mixture of m- and p-forms), 6.9 g (0.05 mol) of potassium carbonate, 100 ml of N,N-dimethylformamide and 2 g of sodium iodide, and the mixture was stirred at 70° C. for 6 hours. After completion of the reaction, the liquor was transferred from the flask into about 1,000 ml of water. The precipitating product was recrystallized from ethanol to obtain 25.3 g of a polymerizable monomer having the following formula (yield=71%):

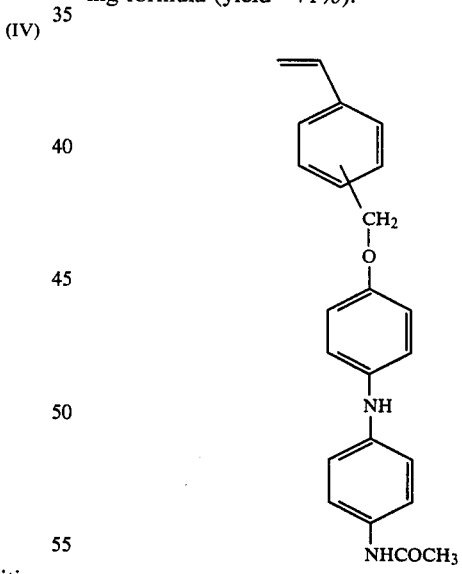

The identity of the product was confirmed by elemental analysis (found N=7.79%, calcd. N=7.82%); NMR spectrum [—COCH$_3\delta$ 2.0 ppm; CH$_2$=CH—$\delta$ 5.23 ppm, 5.8 ppm and 6.8 ppm; —CH$_2$—O—$\delta$ 5.0 ppm in (CD$_3$)$_2$SO], and IR absorption spectrum.

SYNTHESIS EXAMPLE 2

(Preparation of compound (1))

A three-necked flask equipped with a stirrer, a condenser and a nitrogen introducing pipe was charged with 17.9 g of the polymerizable monomer produced in Synthesis Example 1, 92 g of ethanol and 154 g of carbon tetrachloride, and the mixture was heated at 65° C. in a nitrogen atmosphere under stirring. The stirring in a nitrogen atmosphere was continued for a while, and then, a solution of 1.36 g of a polymerization initiator AIBN (azobisisobutyronitrile) in 46 ml of ethanol was added to the reaction mixture, and polymerization was effected for 8 hours. Thereafter, the contents of the flask was transferred into water (2,000 ml) to obtain 17 g of a polymer. The degree of polymerization of this polymer was found to be 4.3 ($\overline{Mn}=1.54\times 10^3$) as measured to the vapor pressure osmotic process (Knauer process) in $(CH_3)_2SO$ at 70° C.

The polymer (14.3 g) was put into a three-necked flask with a stirrer and a condenser. The flask was further charged with conc. hydrochloric acid (20 ml), distilled water (40 ml) and ethanol (40 ml), and the mixture was heated at 75° C. for 6 hours under stirring. Thereafter, the contents of the falsk were transferred into 1,000 ml of acetone to provide 13.8 g of a polymer group. This polymer had an amino group at the p-position and had no acetylamino group present, as confirmed by NMR spectrum and IR absorption spectrum (no absorption at 1680 cm$^{-1}$, 1555 cm$^{-1}$ and 1260 m$^{-1}$ due to —NHCOCH$_3$) and titration of amino groups ($2.55\times 10^{-4}$ eq. of amino groups was detected in 0.1 g of the polymer).

A three-necked flask with a stirrer and a dropping funnel was charged with the polymer powder (13.8 g), conc. hydrochloric acid (35 ml) and distilled water (160 ml), and the mixture was cooled to 0° C. Under vigorous stirring, a solution of sodium nitrite (5.52 g) in distilled water (40 ml) was added dropwise to the reaction mixture in the flask with care taken to ensure that the temperature in the flask would not exceed 3° C. After completion of the addition of the sodium nitrite solution, the mixture was stirred for another one hour at a temperature not higher than 3° C. Thereafter, the temperature of the mixture was restored to room temperature, and part of the insoluble matter was filtered off. The filtrate was added dropwise to a solution of 2-oxy-4-methoxy-benzophenone-5-sulfonic acid (18.5 g) in distilled water (400 ml). The precipitated diazo polymer was filtered and dried. The yield was 20.6 g. Elemental analysis showed that the diazo polymer contained 4.95% S and 6.32% N.

The photosensitive diazo polymer according to the present invention may be used in combination with various synthetic resins in the production of, say, lithographic printing plates. The resins used for this purpose must be oleophilic in order to provide adequate ink receptivity and satisfactory selectivity against the hydrophilic non-image area. These resins must also be soluble in common organic solvents, practically or completely insoluble in water, miscible with the diazo polymer of the present invention, and have the ability to form a film. At the same time, the resins must have a suitable degree of elasticity and wear resistance great enough to withstand a prolonged printing step. Resins that meet these requirements include polymers or condensates such as cresol resins, polyesters, polyamides, polyurethanes, polyvinyl chloride, poly(meth)acrylate, polystyrene and polyvinyl acetate; alkyl esters of acrylic acid and methacrylic acid such as methyl, ethyl and 2-hydroxyethyl (meth)acrylate; acrylamide and their derivatives such as N-alkylacrylamide and p-hydroxyphenylacrylamide; and copolymers derived from polymerizable monomers such as vinyl ethers, vinyl esters and styrenes.

The amount of the diazo polymer to be incorporated in the photosensitive composition of the present invention varies with the type of the support and the use of the composition. Preferably, 1 to 50 wt%, more preferably 3 L to 20 wt%, of the diazo polymer is used. Needless to say, this amount is in terms of a diazonium salt containing unit if the diazo polymer is a copolymer.

The diazo polymer according to the present invention is mixed with the synthetic resin in a solvent to make a coating solution which is applied to the support. Suitable solvents include glycol ethers such as 2-methoxy-ethanol; ketones such as acetone and methyl ethyl ketone; alcohols such as methanol and ethanol; heterocyclic compounds such as N-methylpyrrolidone; and ethers such as trioxane. These solvents may be mixed with not more than 30%, preferably not more than 20%, of water.

The photosensitive diazo polymer according to the present invention is applied, either independently or in combination with the synthetic resin described above, to photographic supports such as metal plates (e.g., aluminum and zinc plates), plastic films (e.g., polyester films) and paper, and the resulting photosensitive material is used in printing and for other purposes. For making a lithographic printing plate, the surface of the support is passivated in order to avoid any deleterious interaction between the support and the diazo compound. This passivation promotes the formation of a strong bond between the diazo polymer and the support in the exposed area and helps provide a hydrophilic surface throughout the printing step. Passivation techniques include treatment with silicates as described in U.S. Pat. No. 2,714,066, treatment with an aqueous solution of potassium fluorozirconate as described in U.S. Pat. No. 2,946,638; treatment with phosphomolybdate as described in U.S. Pat. No. 3,201,247, and silicate electrodeposition as described in U.S. Pat. No. 3,658,662.

The photosensitive diazo polymer according to the present invention may be combined with various photographic additives aside from the synthetic resin described above. Suitable additives include plasticizers (e.g., dibutyl phthalate, tricresyl phosphate and other esters) that provide a coated film with increased elasticity and wear resistance; substances that give color to the image area (e.g., acridine dyes, cyanine dyes, triarylmethane dyes and phthalocyanine dyes); substances that develop color upon exposure (e.g., azide compounds); and stabilizers (e.g., phosphoric acid, oxalic acid and citric acid).

The photosensitive composition of the present invention comprises the diazo polymer, synthetic resins and photographic additives, and the amount of this composition applied to the photographic support is very important for the purposes of the present invention. If its amount is too great, the resulting thick coated film prevents satisfactory development within a given period or adequate penetration of light is not obtained within a given exposure time. On the other hand, if too small an amount of the composition is applied to the support, the thinness of the film deposited on the image area reduces the wear resistance of the film and greatly impairs the commercial value of the final product. Therefore, the photosensitive composition of the present invention is preferably applied to the support in an amount of 0.1 to 5 g/m², more preferably from 0.3 to 4 g/m².

The photosensitive composition on the support is exposed through an original having a line or dot image and developed with an aqueous developer to provide a negative image. Most printing plates contain more synthetic resins than the diazo resin, and in development of these plates, a small amount of organic solvent and surfactant may be incorporated in the aqueous developer. To eliminate any adverse effect on the image area, it is preferred that the development time is short and the concentration of the organic solvent is low. Typical organic solvents include lower alcohol esters, glycol ethers and ketones.

The photosensitive composition of the present invention is hereunder described in greater detail by reference to working examples which are given here for illlustrative purposes only and are by no means intended to limit the scope of the invention.

EXAMPLE 1

An aluminum plate 0.3 mm thick was degreased by immersion in a 10% aqueous solution of sodium tertiary phosphate (80° C.) for 3 minutes. After graining with a nylon brush, the plate was etched for about 10 seconds with sodium aluminate (60° C.) and desmutted with a 3% aqueous solution of sodium hydrogensulfate. The aluminum plate was then anodically oxidized in 20% sulfuric acid for 2 minutes at 2 L A/dm². Thereafter, the plate was treated with a 2.5% aqueous solution of sodium silicate (70° C.) for one minute.

The resulting anodically oxidized aluminum plate (I) was coated with a photosensitive solution of the following formulation containing either the diazo compound of the present invention or comparative compound A defined below. The resulting web was dried at 80° C. for 2 minutes, and the coating weight of the photosensitive solution was 2.0 g/m² on a dry basis.

| Photosensitive solution | |
|---|---|
| Compound of the present invention or comparative compound A | 0.1 g |
| 2-Hydroxyethyl methacrylate copolymer (I) | 0.87 g |
| Oil Blue #603 (product of Orient Chemical Industry Co., Ltd.) | 0.03 g |
| 2-Methoxyethanol | 6.0 g |
| Methanol | 6.0 g |

Comparative compound A

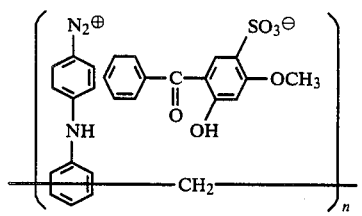

2-Hydroxyethyl methacrylate copolymer (I)
(Copolymer described in Japanese Patent Publication No. 34929/80)

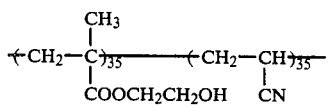

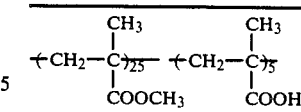

*The subscripts following the closing parentheses indicate the mole ratio.

The resulting four samples of presensitized lithographic printing plate (Sample No. 1 contained Comparative Compound A, and Samples Nos. 2 to 4 contained the compounds of the present invention) were set in a vacuum printing frame and exposed to PS Lite S type (metal halide lamp by Fuji Photo Film Co., Ltd., 2 kW) at a distance of 1 m. The exposed plates were immersed in a developing solution of the following formulation at room temperature for 1 hour, and thereafter, the surface of the plates was lightly rubbed with cotton swab to remove the unexposed portion. By this procedure, four samples of lithographic printing plate were prepared.

| Developer | |
|---|---|
| Sodium sulfite | 3 g |
| Benzyl alcohol | 30 g |
| Triethanolamine | 20 g |
| Monoethanolamine | 5 g |
| Perex NBL (Sodium t-butylnaphthalenesulfonate by Kao-Atlas Company, Ltd.) | 30 g |
| Water | 1,000 ml |

To determine the exposure time, Samples Nos. 2 to 4 were exposed through a step wedge so designed as to harden Sample No. 1 (containing Comparativve Compound A) upon 50-minute exposure through the fifth step (providing the highest wedge density), and the time necessary to cause the same degree of hardening in the three samples was measured. The results are shown in Table 1, from which one can see that Samples Nos. 2 to 4 using the diazo compounds according to the present invention were more sensitive than Sample No. 1 using Comparative Compound A.

TABLE 1

| Sample No. | Diazo Compound | Exposure Time |
|---|---|---|
| 1 | Comparative Compound A | 50 sec |
| 2 | Compound (1) | 22 sec |
| 3 | Compound (3) | 21 sec |
| 4 | Compound (11) | 21 sec |

The four samples of lithographic plate were set in a GTO printing press of Heidelberg AG and printing was made on sheets of quality paper with a commercial ink composition. Like Sample No. 1, Nos. 2 to 4 produced 50,000 copies of good quality.

EXAMPLE 2

An aluminum plate (I) the same as used in Example 1 was coated with a photosensitive solution of the following formulation.

TABLE 2

| Compound (1) of the present invention | 0.1 g |
|---|---|
| Copolymer (II), (III) or (IV) indicated in Table 2 | 0.87 g |
| Oil Blue #603 | 0.03 g |
| 2-Methoxyethanol | 6.0 g |
| Methanol | 6.0 g |

Co-

TABLE 2-continued poly-
mer    Monomer proportions of copolymer (mole ratio)

(II) 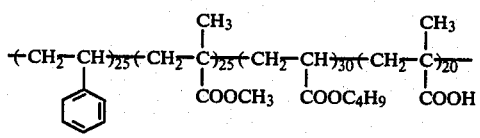

(III) 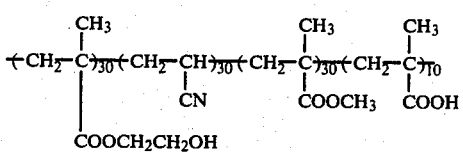

(IV) 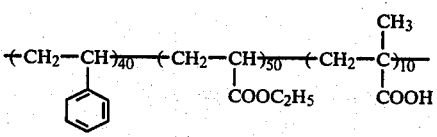

The resulting presensitized lithographic plates were processed and subjected to printing as in Example 1. Again, copies of good quality were produced.

While the invention has been described in detail and with reference to specific embodiment thereof, it will be apparent to one skilled in the art that various changes and modifications can be made therein without departing from the spirit and scope thereof.

What is claimed is:

1. A photosensitive composition comprising a diazonium salt containing polymer or copolymer having a repeating unit of formula:

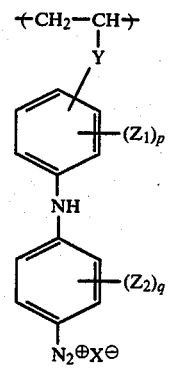

wherein Y is a divalent substituent represented by $-B)_m(C)_n$ and C is directly bonded to the phenyl group at the para position with respect to the NH group with B directly attached to the carbon atom of the main chain in the polymer, wherein C represents —O—, B is a substituted aralkylene group, and m and n are 1; $Z_1$ and $Z_2$ independently each represents a monovalent substituent; p and q are each 0 or an integer of 1 to 4; when p and q are each 2 or more, each of $Z_1$ and $Z_2$ may be at the same or different; $X^-$ is an anion; and wherein said diazonium salt containing polymer or copolymer having a repeating unit of formula (I) is contained in an amount of 1 to 50 wt% based on the total weight of the photosensitive composition.

2. A photosensitive composition as claimed in claim 1, wherein
$Z_1$ and $Z_2$ each represent a monovalent substitutent selected from the group consisting of an alkoxy group having 1 to 6 carbon atoms and an alkyl group having 1 to 6 carbon atoms.

3. A photosensitive composition as claimed in claim 2, wherein Y contains an ether bond derived from an active halogen and a phenolic hydroxyl group.

4. A photosensitive composition as claimed in claim 1, wherein $X^\oplus$ is an anion selected from the group consisting of hydrohalogenic acids, phosphoric acids, aliphatic or aromatic phosphonic acids, halogenated Lewis acids, perhalogenic acids, and aliphatic or aromatic sulfonic acids.

5. A photosensitive composition as claimed in claim 1, wherein the copolymer contains 40 mol% or more of the diazonium salt unit.

6. A photosensitive composition as claimed in claim 1, wherein the polymer or copolymer has a degree of polymerization in the range of 2 to 500.

7. A photosensitive composition as claimed in claim 6, wherein the degree of polymerization is in the range of 2 to 200.

8. A photosensitive composition as claimed in claim 1, wherein the diazonium salt containing unit is present in an amount in the range of 3 to 20 wt%.

* * * * *